(12) United States Patent
Tsukihara et al.

(10) Patent No.: US 11,065,692 B2
(45) Date of Patent: Jul. 20, 2021

(54) DIAMOND-COATED TOOL

(71) Applicant: SUMITOMO ELECTRIC HARDMETAL CORP., Itami (JP)

(72) Inventors: Nozomi Tsukihara, Itami (JP); Rintaro Sugimoto, Itami (JP); Yutaka Kobayashi, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 16/641,850

(22) PCT Filed: May 9, 2019

(86) PCT No.: PCT/JP2019/018544
§ 371 (c)(1),
(2) Date: Feb. 25, 2020

(87) PCT Pub. No.: WO2020/008722
PCT Pub. Date: Jan. 9, 2020

(65) Prior Publication Data
US 2020/0215620 A1    Jul. 9, 2020

(30) Foreign Application Priority Data

Jul. 2, 2018  (JP) .............................. JP2018-126162

(51) Int. Cl.
*B23B 27/14* (2006.01)
*C23C 16/27* (2006.01)
(52) U.S. Cl.
CPC .......... *B23B 27/148* (2013.01); *C23C 16/271* (2013.01); *B23B 2226/31* (2013.01); *B23B 2228/10* (2013.01)

(58) Field of Classification Search
CPC .............. B23B 27/148; B23B 2226/31; B23B 2228/10; C23C 16/271; C23C 28/044; C23C 16/0272
See application file for complete search history.

(56) References Cited

U.S. PATENT DOCUMENTS

| 5,236,740 | A |  | 8/1993 | Peters et al. |
| 2011/0250394 | A1 |  | 10/2011 | Yoshida et al. |
| 2013/0202849 | A1 | * | 8/2013 | Baik ....................... C23C 16/30 |
| | | | | 428/141 |
| 2015/0132539 | A1 | * | 5/2015 | Bailey ................. C23C 16/0254 |
| | | | | 428/141 |
| 2018/0347034 | A1 | * | 12/2018 | Bolz ..................... C23C 14/022 |

FOREIGN PATENT DOCUMENTS

| JP | H01-317112 A | 12/1989 |
| JP | H05-179450 A | 7/1993 |
| JP | 2011-20179 A | 2/2011 |
| JP | 2013-111711 A | 6/2013 |
| WO | WO-2008/105519 A1 | 9/2008 |
| WO | WO-2011/018917 A1 | 2/2011 |

* cited by examiner

*Primary Examiner* — Nathan L Van Sell
(74) *Attorney, Agent, or Firm* — Faegre Drinker Biddle & Reath LLP

(57) ABSTRACT

A diamond-coated tool includes: a substrate; and a diamond layer that coats the substrate, wherein the diamond layer includes a first region that is in contact with the substrate, the first region includes a region S1 surrounded by an interface P between the substrate and the diamond layer and an imaginary plane V1 separated from the interface P by a distance of 2 μm, and the region S1 has crystal grains grown in random directions.

10 Claims, 5 Drawing Sheets

DIAMOND-COATED TOOL

TECHNICAL FIELD

The present disclosure relates to a diamond-coated tool. The present application claims a priority based on Japanese Patent Application No. 2018-126162 filed on Jul. 2, 2018, the entire content of which is incorporated herein by reference.

BACKGROUND ART

Diamond, which has very high hardness, has been used for various tools such as a cutting tool, an abrasion-resistant tool, a grinding tool, and a friction stir welding tool. Particularly, after establishment of a diamond thin film manufacturing technique employing a chemical vapor deposition (CVD) method in 1980s, a diamond-coated tool has been developed. The diamond-coated tool is obtained by coating, with diamond, a surface of a cutting tool having a complicated curved surface or a surface of a wear-resistant tool. Examples of the cutting tool having a complicated curved surface include a drill, an end mill, and the like. Examples of the wear-resistant tool include a drawing die.

Japanese Patent Laying-Open No. 2013-111711 (Patent Literature 1) discloses a diamond-coated cemented carbide cutting tool having a tungsten-based cemented carbide serving as a substrate, wherein a diamond film is provided on the substrate.

Japanese Patent Laying-Open No. 5-179450 (Patent Literature 2) discloses a cemented tungsten carbide product having a cemented tungsten carbide supporting body coated with a diamond film.

CITATION LIST

Patent Literature

PTL 1: Japanese Patent Laying-Open No. 2013-111711
PTL 2: Japanese Patent Laying-Open No. 5-179450

SUMMARY OF INVENTION

A diamond-coated tool according to one embodiment of the present disclosure is a diamond-coated tool including: a substrate; and a diamond layer that coats the substrate, wherein
the diamond layer includes a first region that is in contact with the substrate,
the first region includes a region S1 surrounded by an interface P between the substrate and the diamond layer and an imaginary plane V1 separated from the interface P by a distance of 2 μm, and
the region S1 has crystal grains grown in random directions.

DETAILED DESCRIPTION

Figure 1:
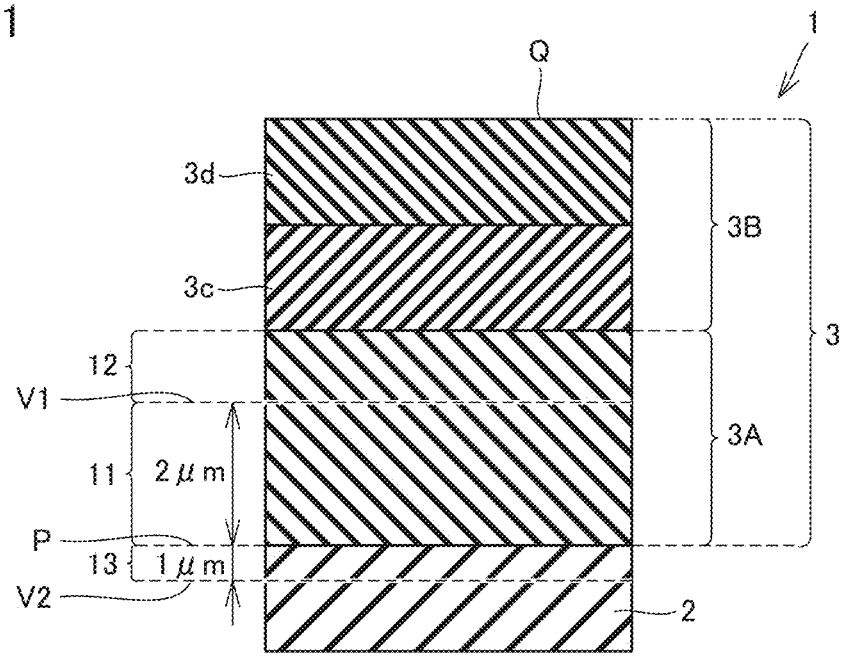
FIG. 1 is a schematic cross sectional view of a diamond-coated tool according to one embodiment of the present disclosure.

Problem to be Solved by the Present Disclosure

Demands are increasing for diamond-coated tools as processing tools for fiber reinforced plastics (FRP), nonmetals, glasses, cemented carbides each of which is a highly brittle material for metal molds, and difficult-to-cut materials such as ceramics. Demands for the fiber reinforced plastics are increasing in the aircraft industry. When the diamond-coated tool is applied to processing of a difficult-to-cut material, wear is likely to occur during the processing, with the result that the tool life tends to be short.

In recent years, requests for high-efficient processing have become severe. Such high-efficient processing is also required in the above-described processing of the difficult-to-cut material. When the diamond-coated tool is applied to the high-efficient processing of the difficult-to-cut material, film detachment is likely to occur between the substrate and the diamond layer, with the result that the tool life tends to be shorter.

Thus, the present object is to provide a diamond-coated tool that can have a long tool life even in high-efficient processing of a difficult-to-cut material.

Advantageous Effect of the Present Disclosure

According to the above-described embodiment, the diamond-coated tool can have a long tool life even in high-efficient processing of a difficult-to-cut material.

DESCRIPTION OF EMBODIMENTS

First, embodiments of the present disclosure are listed and described.

(1) A diamond-coated tool according to one embodiment of the present disclosure is a diamond-coated tool including: a substrate; and a diamond layer that coats the substrate, wherein
the diamond layer includes a first region that is in contact with the substrate,
the first region includes a region S1 surrounded by an interface P between the substrate and the diamond layer and an imaginary plane V1 separated from the interface P by a distance of 2 μm, and
the region S1 has crystal grains grown in random directions.

According to the above-described embodiment, the diamond-coated tool can have a long tool life even in high-efficient machining of a difficult-to-cut material.

(2) Preferably, the first region includes diamond grains having a volume average grain size r1 of more than or equal to 0.1 μm and less than or equal to 2 μm. Accordingly, a nucleation density of the diamond crystals in the vicinity of the interface between the substrate and the diamond layer becomes high, with the result that adhesion force between the substrate and the diamond layer is improved.

(3) Preferably, the diamond layer includes a second region formed on the first region, the second region includes one or more unit layers, the unit layers include a first unit layer that is in contact with the first region, and a ratio (r1/r2) of the r1 and r2 is more than or equal to 0.05 and less than or equal to 20, where the r2 represents a volume average grain size of diamond grains included in the first unit layer.

Accordingly, a long-life tool for a wide range of materials can be obtained. Examples of the wide range of materials include: a highly brittle material such as a cemented carbide; a composite material such as a CFRP (carbon fiber reinforced plastic); and the like.

(4) Preferably, the diamond layer includes a second region formed on the first region, the second region includes one or more unit layers, and an average residual stress σ1 of the first region is different from an average residual stress σ2 of a first unit layer that is in contact with the first region. Accordingly, progress of crack is suppressed by the difference in stress between the layers, and adhesion force between the layers is excellent.

(5) Preferably, the diamond layer includes a second region formed on the first region,
the second region includes one or more unit layers, and
a ratio (I1/I2) of I1 and I2 is more than or equal to 0.1 and less than or equal to 10, where the T1 represents a sp3 intensity ratio of the first region and the I2 represents a sp3 intensity ratio of a first unit layer that is in contact with the first region.

Accordingly, a long-life tool for a wide range of materials can be obtained. Examples of the wide range of materials include: a highly brittle material such as a cemented carbide; a composite material such as a CFRP (carbon fiber reinforced plastic); and the like.

(6) Preferably, the second region includes two or more unit layers, and the two or more unit layers have respective different volume average grain sizes of diamond grains. Accordingly, progress of crack is suppressed.

(7) Preferably, the second region includes two or more unit layers, and the two or more unit layers have respective different average residual stresses. Accordingly, progress of crack is suppressed by the difference in stress between the layers, and adhesion force between the layers is excellent.

(8) Preferably, the second region includes two or more unit layers, and the two or more unit layers have respective different sp3 intensity ratios. Accordingly, progress of crack is suppressed and the outermost layer is a hard diamond film, thus attaining improved wear resistance.

(9) Preferably, the unit layers include columnar crystals. Accordingly, crack is suppressed from being generated to progress in a direction perpendicular to the crystal growth axis of the diamond film.

(10) Preferably, the substrate includes hard grains having a volume average grain size of more than or equal to 0.1 μm and less than or equal to 10 μm. Accordingly, adhesion force between the substrate and the diamond layer is improved.

(11) Preferably, the substrate has a surface having an arithmetic mean roughness Sa of more than or equal to 0.1 μm and less than or equal to 10 μm. Accordingly, adhesion force between the substrate and the diamond layer is improved.

(12) Preferably, the substrate has a Co content of more than or equal to 0.01 mass % and less than or equal to 4 mass % in a region S3 surrounded by the interface P and an imaginary plane V2 separated from the interface P by a distance of 1 μm. Accordingly, adhesion force between the substrate and the diamond layer is improved.

Details of Embodiments of the Present Disclosure

Specific examples of a diamond-coated tool according to one embodiment of the present disclosure will be described below with reference to figures.

The same reference characters indicate the same or equivalent portions in the figures. Dimensions, such as length, width, thickness, and depth, are appropriately changed for clarification and simplification of the figures, and do not represent actual dimensions.

<Diamond-Coated Tool>

Figure 2:
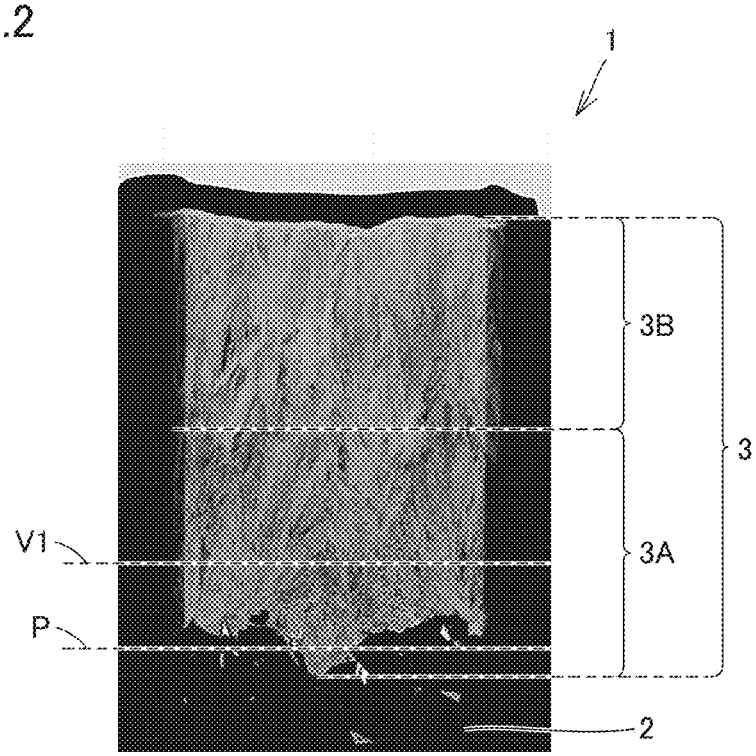
FIG. 2 shows a scanning transmission electron microscope (STEM) photograph of a cross section of a diamond-coated tool according to one embodiment (sample 2 (Example)) of the present disclosure.
Figure 3:
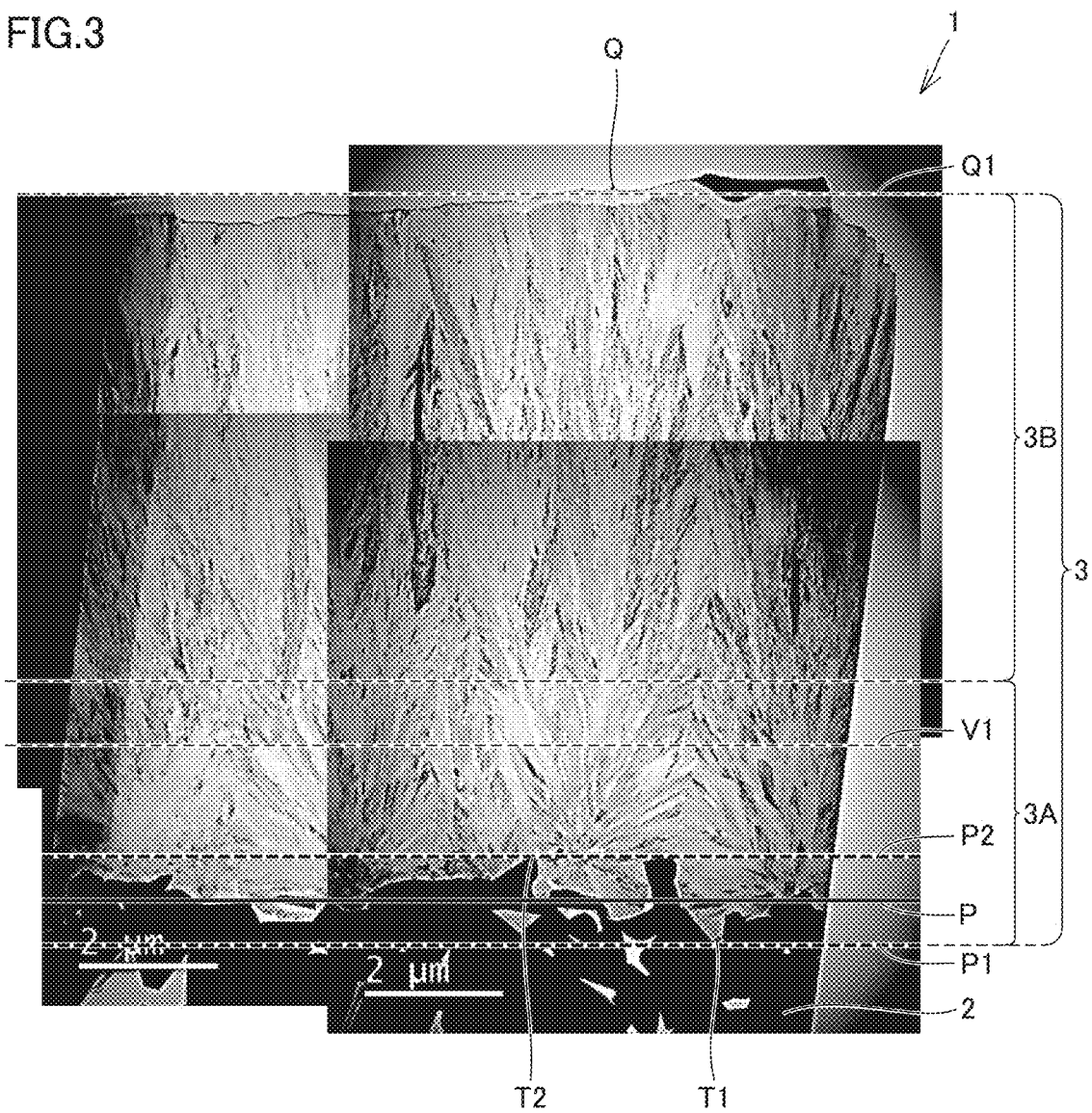
FIG. 3 shows a scanning transmission electron microscope photograph of a cross section of a diamond-coated tool according to another embodiment of the present disclosure.
Figure 4:
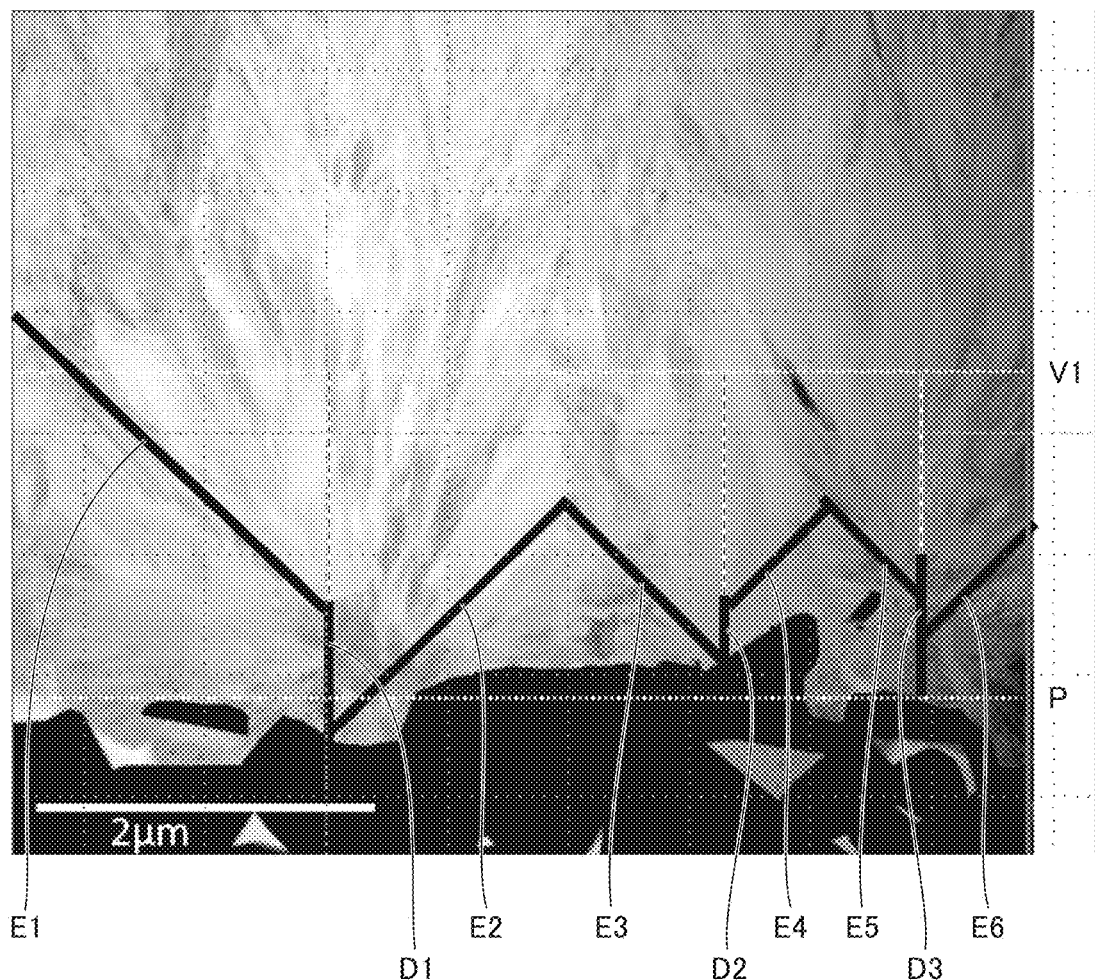
FIG. 4 shows a scanning transmission electron microscope photograph of a measurement visual field of the cross section of the diamond-coated tool shown in FIG. 3.
Figure 5:
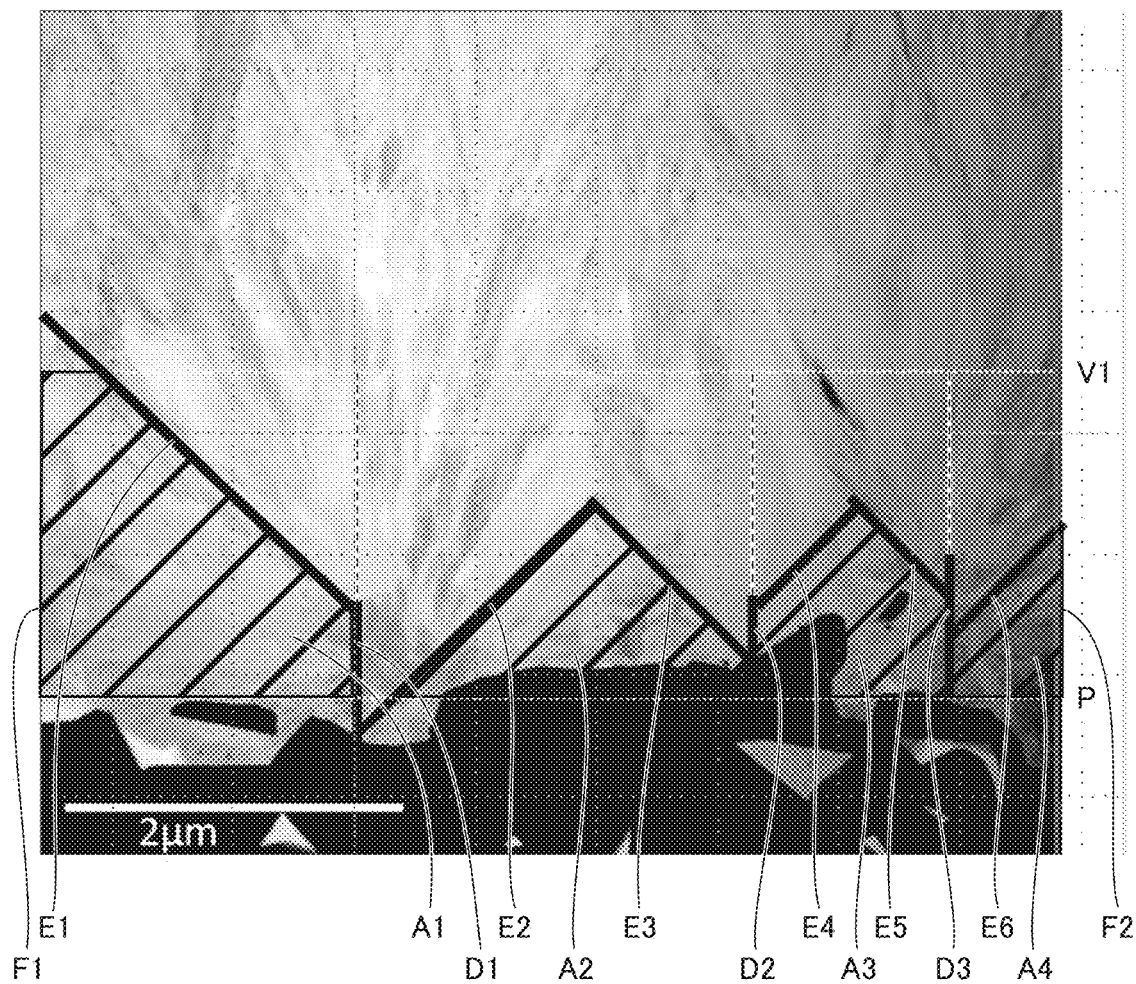
FIG. 5 shows a scanning transmission electron microscope photograph of a measurement visual field of the cross section of the diamond-coated tool shown in FIG. 3.

A diamond-coated tool according to one embodiment of the present disclosure will be described with reference to FIG. 1 to FIG. 5. FIG. 1 is a schematic cross sectional view of a diamond-coated tool according to one embodiment of the present disclosure. FIG. 2 shows a scanning transmission electron microscope (STEM) photograph of a cross section of a diamond-coated tool according to one embodiment of the present disclosure. FIG. 3 shows a scanning transmission electron microscope photograph of a cross section of a diamond-coated tool according to another embodiment of the present disclosure. Each of FIG. 4 and FIG. 5 shows a scanning transmission electron microscope photograph of a measurement visual field of the cross section of the diamond-coated tool shown in FIG. 3.

As shown in FIG. 1, a diamond-coated tool 1 includes a substrate 2 and a diamond layer 3 that coats substrate 2. In addition to the substrate and the diamond layer, the diamond-coated tool can include any other configurations. The diamond layer preferably coats the entire surface of the substrate; however, the substrate having a portion not coated with the diamond layer is not deviated from the scope of the present embodiment.

<Diamond Layer>

In the present embodiment, diamond layer 3 includes a first region 3A that is in contact with substrate 2, and first region 3A includes a region S1 surrounded by an interface P between substrate 2 and diamond layer 3 and an imaginary plane V1 separated from interface P by a distance of 2 μm (imaginary plane V1 is located within diamond layer 3). Here, region S1 in diamond layer 3 of the present embodiment has crystal grains grown in random directions. Accordingly, the diamond-coated tool can have a long tool life even in high-efficient processing of a difficult-to-cut material. It is unknown why this can be attained; however, the present inventors surmise that this is attained due to the following reasons (i) and (ii).

(i) Since the crystal growth direction is anisotropic in a region in which the crystal grains are grown in random directions, cleavage is less likely to occur in a specific direction, with the result that strength is improved. Therefore, detachment resulting from breakage of the diamond layer is less likely to occur in the vicinity of the interface between the substrate and the diamond layer during use of the tool, and the substrate and the diamond layer are firmly adhered to each other. Accordingly, the diamond-coated tool can have a long tool life.

(ii) Since the crystal growth direction is anisotropic in the region in which the crystal grains are grown in random directions, progress of crack can be suppressed even when the crack is generated during use of the tool. Therefore, the diamond-coated tool including such a region can have a long tool life.

In the present specification, the fact that "region S1 has crystal grains grown in random directions" can be confirmed in accordance with the following procedure of (a-1) to (a-5).

(a-1) Determination of Measurement Visual Fields

A measurement sample is cut out from the diamond-coated tool using a diamond saw blade, and is embedded in a resin. Then, a cross section polishing process (hereinafter, also referred to as "CP process") is performed onto a cross section thereof. The cutting and CP process described above are performed such that the cross section becomes parallel to the normal line of interface P between the substrate and the diamond layer.

In the cross section, five rectangular measurement visual fields are set. Each of the measurement visual fields has a width (direction parallel to interface P) of 6 µm and has a height (direction perpendicular to interface P) of 5 µm. Each of the measurement visual fields is set at a position to have a height including the entire height (2 µm) of region S1 in the direction perpendicular to interface P.

As shown in FIG. 3, when the actual interface has irregularities, interface P is set in the following procedure. In the actual interface in the cross section of the measurement sample, an imaginary line P1 is set to pass through a tip T1 that protrudes the most toward the substrate 2 side and is set to be parallel to an upper surface Q of diamond layer 3 (to be parallel to a plane Q1 (hereinafter, also referred to as "reference plane Q1") of an average height of irregularities of upper surface Q when upper surface Q has the irregularities), and an imaginary line P2 is set to pass through a tip T2 that protrudes the most toward the diamond layer 3 side and is set to be parallel to upper surface Q (reference plane Q1) of diamond layer 3. An intermediate line located between imaginary lines P1 and P2 represents interface P.

(a-2) Image Capturing of Measurement Visual Fields

An image of each of the measurement visual fields is captured using the following instrument and under the following conditions.

Scanning transmission electron microscope: "JEM-2100F/Cs" provided by JEOL.

Image capturing conditions: a magnification of 20000× and a light field image.

(a-3) Processing of Captured Scanning Transmission Electron Microscope Photograph The scanning transmission electron microscope photograph captured in (a-2) above is subjected to image processing using the following image processing software in accordance with the following process procedure. The following process procedure is described with reference to FIG. 4 and FIG. 5, each of which shows an exemplary scanning transmission electron microscope photograph of the measurement visual field.

Image processing software: "Winroof" provided by Mitani Corporation.

Process procedure: Crystal grains each having a crystal growth direction of 90° relative to interface P set above are specified in region S1 surrounded by interface P and imaginary plane V1 located to be separated from interface P toward the surface side of the film by a distance of 2 µm. Then, first reference lines are drawn on these crystal grains. The first reference lines are represented by D1, D2, and D3 in FIG. 4 and FIG. 5.

Crystal grains each having a crystal growth direction of 45° relative to each first reference line are specified, and second reference lines are drawn on these crystal grains. Each of the second reference lines is a line segment from its intersection with a first reference line to its intersection with another second reference line. In FIG. 4 and FIG. 5, E1 and E2 represent second reference lines each having an angle of 45° relative to a first reference line D1, E3 and E4 represent second reference lines each having an angle of 45° relative to a first reference line D2, and E5 and E6 represent second reference lines each having an angle of 45° relative to a first reference line D3.

In region S1, a region (hereinafter, also referred to as "random growth crystal grain region") located on the second reference lines and located at the interface P side relative to the second reference lines is specified. In FIG. 5, the random growth crystal grain region is a region including regions A1, A2, A3, and A4 indicated by oblique lines. The following describes a method for specifying regions A1, A2, A3, and A4.

In FIG. 5, region A1 is specified as a region surrounded by first reference line D1, second reference line E1, imaginary plane V1, a frame line F1 of the measurement visual field, and interface P. Region A2 is specified as a region surrounded by first reference line D2, second reference lines E2, E3, and interface P. Region S3 is specified as a region surrounded by first reference lines D2, D3, second reference lines E4, E5, and interface P. Region A4 is specified as a region surrounded by first reference line D3, second reference line E6, a frame line F2 of the measurement visual field, and interface P.

(a-4) Analysis of Image

From the image obtained in (a-3) above, an area ratio (hereinafter, also referred to as "area ratio of random growth crystal grains") of the region (random growth crystal grain region) located on the second reference lines and located at the interface P side relative to the second reference lines, with respect to the total area of region S1 in the measurement visual field is calculated.

(a-5) Criterion

An average value of the "area ratios of the random growth crystal grains" in the five measurement visual fields is calculated. When the average value is more than or equal to 20%, it is determined that "region S1 has crystal grains grown in random directions".

The average value of the area ratios of the random growth crystal grains is preferably more than or equal to 20%, and is more preferably more than or equal to 40%. When the above-described average value is less than 20%, an effect of improving adhesion force between the substrate and the diamond layer tends to be less likely to be obtained. Since a larger area ratio of the random growth crystal grains is more preferable, an upper limit value thereof is not set in particular; however, in view of production, the average value of the area ratios of the random growth crystal grains is preferably less than or equal to 80%.

In diamond-coated tool 1 shown in FIG. 1, first region 3A includes not only region S1 but also a region S2 (corresponding to a reference character 12 in FIG. 1) formed continuous to region S1. First region 3A may be constituted only of region S1 without including region S2.

When first region 3A includes region S2 in addition to region S1, by observing the cross section of the film using a SEM (scanning electron microscope), a TEM (transmission electron microscope), or a STEM (scanning transmission electron microscope), it can be confirmed that region S1 and region S2 are formed continuously.

In region S2, the average value of the area ratios of the random growth crystal grains is preferably more than or equal to 1% and less than or equal to 60%, is more preferably more than or equal to 5% and less than or equal to 50%, and is further preferably more than or equal to 10% and less than or equal to 50%. With this, since the crystal growth direction is anisotropic, progress of crack can be suppressed even when the crack is generated during use of the tool. The area ratio of the random growth crystal grains in region S2 can be measured in accordance with the following procedure of (a'-1) to (a'-4).

(a'-1) Determination of Measurement Visual Fields

A measurement sample is cut out from the diamond-coated tool using a diamond saw blade, and is embedded in a resin. Then, a cross section polishing process (hereinafter, also referred to as "CP process") is performed onto a cross section thereof. The cutting and CP process described above are performed such that the cross section becomes parallel to the normal line of interface P between the substrate and the diamond layer.

In the cross section, five rectangular measurement visual fields are selected at random. Each of the measurement visual fields has a width (direction parallel to interface P) of 6 μm and has a height (direction perpendicular to interface P) including the entire height (direction perpendicular to interface P) of region S2. Each of the measurement visual fields is set at a position to have a height including the entire height of region S2 in the direction perpendicular to interface P.

(a'-2) Image Capturing of Measurement Visual Fields

An image of each of the measurement visual fields is captured using the following instrument and under the following conditions.

Scanning transmission electron microscope: "JEM-2100F/Cs" provided by JEOL.

Image capturing conditions: a magnification of 20000× and a light field image.

(a'-3) Processing of Captured Scanning Transmission Electron Microscope

Photograph

The scanning transmission electron microscope photograph captured in (a'-2) above is subjected to image processing using the following image processing software in accordance with the following process procedure.

Image processing software: "Winroof" provided by Mitani Corporation.

Process procedure: Crystal grains each having a crystal growth direction of 90° relative to interface P are specified in region S2, and first reference lines are drawn on the crystal grains.

Crystal grains each having a crystal growth direction of 45° relative to each first reference line are specified, and second reference lines are drawn on the crystal grains. Each of the second reference lines is a line segment from its intersection with a first reference line to its intersection with another second reference line.

In region S2, a region (hereinafter, also referred to as "random growth crystal grain region") located on the second reference lines and located at the interface P side relative to the second reference lines is specified.

(a'-4) Analysis of Image

From the image obtained in (a'-3) above, an area ratio (hereinafter, also referred to as "area ratio of random growth crystal grains") of the region (random growth crystal grain region) located on the second reference lines and located at the interface P side relative to the second reference lines, with respect to the total area of region S2 in the measurement visual field is calculated.

A volume fraction of region S1 in the first region is preferably more than or equal to 1 volume % and less than or equal to 100 volume %, is more preferably more than or equal to 6 volume % and less than or equal to 100 volume %, and is further preferably more than or equal to 8 volume % and less than or equal to 100 volume %. On the other hand, a volume fraction of region S2 in the first region is preferably more than or equal to 0 volume % and less than 99 volume %, is more preferably more than or equal to 0 volume % and less than 92 volume %, and is further preferably more than or equal to 0 volume % and less than 86 volume %. This leads to very excellent adhesion between the substrate and the diamond, and a very excellent effect of suppressing progress of crack.

The volume fractions of region S1 and region S2 in the first region can be calculated respectively by measuring the areas of region S1 and region S2 in the cross section of the diamond-coated tool. Specifically, the calculation can be performed in accordance with the following procedure of (b-1) to (b-4).

(b-1) Determination of Measurement Visual Fields

A measurement sample is cut out from the diamond-coated tool using a diamond saw blade, and is embedded in a resin. Then, a cross section polishing process (hereinafter, also referred to as "CP process") is performed onto a cross section thereof. The cutting and CP process described above are performed such that the cross section becomes parallel to the normal line of interface P between the substrate and the diamond layer.

In the cross section, five rectangular measurement visual fields are selected at random. Each of the measurement visual fields has a width (direction parallel to interface P) of 6 μm and has a height (direction perpendicular to interface P) including the entire height (direction perpendicular to interface P) of the first region.

(b-2) Image Capturing of Measurement Visual Fields

An image of each of the measurement visual fields is captured using the following instrument and under the following conditions.

Scanning transmission electron microscope: "JEM-2100F/Cs" provided by JEOL.

Image capturing conditions: a magnification of 20000× and a light field image.

(b-3) Processing of Captured Image

The image captured in (b-2) above is subjected to image processing using the following image processing software in accordance with the following procedure.

Image processing software: "Winroof" provided by Mitani Corporation.

Process procedure: Region S1 and region S2 are surrounded by lines and are filled in with different patterns.

(b-4) Analysis of Image

From the image obtained in (b-3) above, the "area ratio of region S1 with respect to the area of the first region" and the "area ratio of region S2 with respect to the entire area of the first region" are calculated.

An average value of the "area ratios of regions S1 with respect to the entire areas of the first regions" in the five measurement visual fields corresponds to the "volume fraction of region S1 in the first region". An average value of the "area ratios of regions S2 with respect to the entire areas of the first regions" in the five measurement visual fields corresponds to the "volume fraction of region S2 in the first region".

The first region preferably includes diamond grains having a volume average grain size r1 of more than or equal to 0.1 μm and less than or equal to 2 μm. Accordingly, a nucleation density of the diamond crystals in the vicinity of the interface between the substrate and the diamond layer becomes high, with the result that adhesion force between the substrate and the diamond layer is improved. Volume average grain size r1 of the diamond grains is more preferably more than or equal to 0.1 μm and less than or equal to 1.5 μm, and is further preferably more than or equal to 0.1 μm and less than or equal to 1 μm.

In the present specification, the "volume average grain size" refers to a median size (d50) in a volume-based grain size distribution (volume distribution). The expression "the volume average grain size of the diamond grains included in the first region" is intended to mean the volume average grain size of all the diamond grains included in the first region.

The grain size of each grain for calculating the volume average grain size of the diamond grains and the volume average grain size of the diamond grains can be measured in accordance with the following procedure of (c-1) to (c-4).

(c-1) Determination of Measurement Visual Field

A measurement sample is cut out from the diamond-coated tool using a diamond saw blade, and is embedded in a resin. Then, a cross section polishing process (hereinafter, also referred to as "CP process") is performed onto a cross section thereof. The cutting and CP process described above are performed such that the cross section becomes parallel to the normal line of interface P between the substrate and the diamond layer.

In the cross section, one rectangular measurement visual field having a width (direction parallel to interface P) of 6 μm and a height of 5 μm is selected at random. The measurement visual field is set at a position to have a height including the entire height of first region 3A in the direction perpendicular to interface P.

(c-2) Observation of Measurement Visual Field

An image of the measurement visual field is captured using the following instrument and under the following conditions.

Scanning transmission electron microscope: "JEM-2100F/Cs" provided by JEOL.

Image capturing conditions: a magnification of 5000× and a light field image.

(c-3) Measurement of Circumscribed-Circle Equivalent Diameter

In a reflected electron image obtained in (c-2) above, the diameter (i.e., circumscribed-circle equivalent diameter) of a circle circumscribed to each diamond grain is measured. In the present specification, the circumscribed-circle equivalent diameter represents the grain size of a diamond grain.

(c-4) Calculation of Volume Average Grain Size

The grain sizes of all the diamond grains in the measurement visual field are measured, and the volume average grain size is calculated based on the values of the grain sizes. The volume average grain size calculated based on all the diamond grains in the measurement visual field corresponds to the "volume average grain size of the diamond grains included in the first region".

As shown in FIG. 1, diamond layer 3 can include a second region 3B formed on first region 3A. An interface between first region 3A and second region 3B can be confirmed by observing the cross section of the film using a SEM (scanning electron microscope), a TEM (transmission electron microscope), or a STEM (scanning transmission electron microscope).

Second region 3B can include one or more unit layers. In FIG. 1, second region 3B includes two unit layers, i.e., a first unit layer 3c and a second unit layer 3d; however, the number of unit layers is not limited to two. The number of the unit layers included in the second region can be one or can be more than or equal to three.

A ratio (r1/r2) of r1 and r2 is preferably more than or equal to 0.05 and less than or equal to 20, where r1 represents the volume average grain size of the diamond grains included in first region 3A and r2 represents the volume average grain size of the diamond grains included in first unit layer 3c that is in contact with first region 3A. Accordingly, a long-life tool for a wide range of materials can be obtained. Examples of the wide range of materials include: a highly brittle material such as a cemented carbide; a composite material such as a CFRP; and the like. The ratio (r1/r2) is more preferably more than or equal to 0.1 and less than or equal to 20, and is further preferably more than or equal to 0.1 and less than or equal to 10. The ratio (r1/r2) may be more than or equal to 0.1 and less than or equal to 1, or may be more than or equal to 0.1 and less than or equal to 0.6.

A method for calculating volume average grain size r2 of the diamond grains included in first unit layer 3c is basically the same as the method for calculating volume average grain size r1 of the diamond grains included in first region 3A. A different therebetween lies in that one rectangular measurement visual field is set to have a width (direction parallel to interface P) of 6 μm and have a height including the entire height of first unit layer 3c in the direction perpendicular to interface P. The measurement visual field is set at a position to have a height including the entire height (direction perpendicular to interface P) of the first unit layer.

When each of the diamond grains included in first unit layer 3c is a columnar crystal, the grain size of each grain can be measured by the following method. In the reflected electron image obtained in (c-2) above, it is assumed that the grain size of the diamond grain is represented by the diameter of a true circle having the same area as the area (l×w) of the crystal grain calculated based on l and w, where l represents the grain length of the diamond grain in a longitudinal direction and w represents the grain width of the diamond grain in a direction perpendicular to the longitudinal direction. In the present specification, the term "columnar crystal" is defined as a crystal having an aspect ratio (l×w) value of more than or equal to 2.

r2 is preferably more than or equal to 0.1 μm and less than or equal to 20 μm, is more preferably more than or equal to 0.5 μm and less than or equal to 10 μm, and is further preferably more than or equal to 0.5 μm and less than or equal to 5 μm. r2 can be more than or equal to 0.5 μm and less than or equal to 2 μm, or can be more than or equal to 0.5 μm and less than or equal to 1 μm.

Second region 3B can include two or more unit layers. In this case, the two or more unit layers preferably include respective different volume average grain sizes of diamond grains. For example, in diamond-coated tool 1 shown in FIG. 1, volume average grain size r2 of the diamond grains included in first unit layer 3c is preferably different from volume average grain size r3 of the diamond grains included in second unit layer 3d. Accordingly, progress of crack is suppressed at a boundary between the layers.

Assuming that an x-th unit layer and an (x+1)-th unit layer are adjacent unit layers in the second region, a ratio $(r_x/r_{(x+1)})$ of $r_x$ and $r_{(x+1)}$ is preferably more than or equal to 0.1 and less than or equal to 20, is more preferably more than or equal to 0.5 and less than or equal to 10, and is further preferably more than or equal to 0.5 and less than or equal to 5, where $r_x$ represents a volume average grain size of diamond grains included in the x-th unit layer and $r_{(x+1)}$ represents a volume average grain size of diamond grains included in the (x+1)-th unit layer. Accordingly, by adjusting film quality of each layer, it is possible to form a film that can cope with processing of a wide range of materials under a wide range of conditions.

The method for calculating volume average grain size $r_x$ of the diamond grains included in the x-th unit layer is basically the same as the method for calculating volume average grain size r1 of the diamond grains included in first region 3A. A different therebetween lies in that one rectangular measurement visual field is set to have a width (direction parallel to interface P) of 6 μm and have a height including the entire height of the x-th unit layer in the direction perpendicular to interface P.

Preferably, diamond layer 3 includes second region 3B formed on first region 3A, second region 3B includes one or more unit layers, and an average residual stress of first region 3A is different from an average residual stress of first unit layer 3c that is in contact with first region 3A. Accordingly, since the whole of the diamond layer has a compressive residual stress, progress of crack is suppressed during use of the tool, whereby the wear resistance of the diamond-coated tool is improved.

The compressive residual stress is one type of internal stress (inherent strain) in the diamond layer, and is indicated by a negative numerical value (unit: GPa). On the other hand, tensile residual stress is one type of internal stress in the diamond layer, and is indicated by a positive numerical value (unit: GPa). In the present specification, the term "residual stress" (also inclusive of a case of 0 GPa) represents a concept including the compressive residual stress and the tensile residual stress.

Average residual stress σ1 of the first region is preferably more than or equal to −3 GPa and less than or equal to 3 GPa, is more preferably more than or equal to −2 GPa and less than or equal to 2 GPa, and is further preferably more than or equal to −1 GPa and less than or equal to 1 GPa.

Average residual stress σ2 of the first unit layer is preferably more than or equal to −3 GPa and less than or equal to 2 GPa, is more preferably more than or equal to −2.5 GPa and less than or equal to 1 GPa, and is further preferably more than or equal to −2 GPa and less than or equal to 1 GPa.

The absolute value of a difference (σ1-σ2) between average residual stress σ1 of the first region and average residual stress σ2 of the first unit layer is preferably more than or equal to 0.01 and less than or equal to 3, is more preferably more than or equal to 0.05 and less than or equal to 2, and is further preferably more than or equal to 0.1 and less than or equal to 1.5. Accordingly, progress of crack is suppressed by the difference in stress between the layers, and adhesion force between the layers is excellent.

Second region 3B can include two or more unit layers. In this case, the two or more unit layers preferably have different average residual stresses. For example, in diamond-coated tool 1 shown in FIG. 1, average residual stress σ2 of first unit layer 3c is preferably different from average residual stress σ3 of second unit layer 3d. Accordingly, progress of crack is suppressed by the difference in stress between the layers, and adhesion force between the layers is excellent.

Assuming that the x-th unit layer and the (x+1)-th unit layer are adjacent unit layers in the second region, the absolute value of a difference ($\sigma_x - \sigma_{(x+1)}$) between average residual stress $\sigma_x$ of the x-th unit layer and average residual stress $\sigma_{(x+1)}$ of the (x+1)-th unit layer is preferably more than or equal to 0.01 and less than or equal to 3, is more preferably more than or equal to 0.05 and less than or equal to 2, and is further preferably more than or equal to 0.1 and less than or equal to 1.5. Accordingly, progress of crack is suppressed by the difference in stress between the layers, and adhesion force between the layers is excellent.

An average residual stress of the whole of diamond layer 3 is preferably more than or equal to −5 GPa and less than or equal to 5 GPa, is more preferably more than or equal to −3 GPa and less than or equal to 3 GPa, and is further preferably more than or equal to −2 GPa and less than or equal to 2 GPa. When the residual stress is more than 5 GPa, rigidity of the diamond layer may become insufficient. When the residual stress is less than −5 GPa, self-breakage of the diamond layer may occur.

In the present specification, the "average residual stress" can be measured by Raman spectroscopy. The following describes details of the measurement technique.

When the diamond crystal is analyzed by the Raman spectroscopy, a sharp spectrum is observed around 1332 $cm^{-1}$ on the obtained Raman spectrum. This is a peak originating from an optical phonon of the diamond structure. When a strain is caused due to a factor such as stress in the diamond crystal, a strain is also caused in a bond in the crystal. Accordingly, vibration of a material and phonon scattering, which are obtained by the Raman spectrum, are also affected by the strains, thus changing energy thereof. On the Raman spectrum, each of these strains can be observed in the form of a peak shift. Therefore, by measuring a difference in peak from a sample not fed with stress, the stress of the measurement sample can be calculated.

Specifically, laser light having a specific single wavelength is emitted to the sample, and Stokes scattered light scattered from the sample is received by a spectrometer and a photomultiplier tube, thereby obtaining a Raman spectrum. As a measurement device, "LabRAM HR-800" provided by HORIBA JOBIN YVON can be used, for example.

In the measurement method, fixed-point analysis is linearly performed from the surface layer of the diamond film of the sample having been subjected to the cross section processing to the interface with the substrate so as to obtain a Raman spectrum at each point. Then, the peak of the diamond is fitted with a Lorentz function, thereby obtaining a peak position v thereof. Next, a difference Δ from a speak position v0 of a Raman spectrum of diamond powder, which is a standard sample having a stress of 0, is calculated. By multiplying the obtained difference Δ by a stress conversion factor of 0.617 ($GPa/cm^{-1}$) (reference: Diamond and Related Materials, vol. 5, 1996, p. 1159-1165), the stress of the entire film can be calculated.

For a light source used above, a semiconductor laser light source (wavelength of 532 nm) can be used, for example. Moreover, the laser light source desirably has an intensity of about 0.1 mW to 1.0 mW.

The cross section of the sample is desirably smoothed by the cross section polishing process. Accordingly, a precise Raman spectrum with a high instensity can be obtained.

Diamond layer 3 includes second region 3B formed on first region 3A, second region 3B includes one or more unit layers, and a ratio (I1/I2) of I1 and I2 is preferably more than or equal to 0.1 and less than or equal to 10, where I1 represents a sp3 intensity ratio of first region 3A and I2 represents a sp3 intensity ratio of first unit layer 3c that is in contact with first region 3A. Accordingly, a long-life tool for a wide range of materials can be obtained. Examples of the wide range of materials include: a highly brittle material such as a cemented carbide; a composite material such as a CFRP (carbon fiber reinforced plastic); and the like. The ratio (I1/I2) is more preferably more than or equal to 0.15 and less than or equal to 6.5, and is further preferably more than or equal to 0.25 and less than or equal to 4.

In the present specification, the term "sp3 intensity ratio" represents a concept indicating a ratio of sp3 bonds of all the bonds included in the first region or each unit layer. Examples of types of the bonds included in the first region or each unit layer include: a sp3 bond in the diamond crystal; and a sp2 bond of amorphous carbon existing in a grain boundary.

The "sp3 intensity ratio" can be calculated in accordance with the following procedure of (d-1) to (d-3).

(d-1) Raman Spectroscopic Analysis

For the first region or each unit layer, a spectrum is measured using a laser Raman measurement method in accordance with JIS-K0137 (2010). For a Raman spectroscopic device, "Ramantouch" provided by Nanophoton Corporation is used.

(d-2) Processing of Spectrum

Peak splitting processing is performed by performing multiple scattering removal processing onto the spectrum obtained in (d-1) above using the following software.

Image processing software: "Ramanimager" provided by Nanophoton Corporation (d-3) Analysis of Spectrum From the spectrum obtained in (d-2) above and having been through the peak splitting processing, an integrated intensity of a peak around a wave number of 1332 cm$^{-1}$ caused by an optical phonon of the diamond structure with respect to an integrated intensity of all the spectra is calculated. A resulting value represents the "sp3 intensity ratio". Here, the sp3 intensity ratio is changed greatly depending on a laser wavelength to be used. Hence, in the present specification, a value obtained when measuring using a laser light source having a wavelength of 532 nm is defined as the sp3 intensity ratio.

Sp3 intensity ratio I1 of the first region is preferably more than or equal to 0.002 and less than or equal to 0.02, is more preferably more than or equal to 0.005 and less than or equal to 0.02, and is further preferably more than or equal to 0.01 and less than or equal to 0.02. Sp3 intensity ratio I2 of the first unit layer is preferably more than or equal to 0.002 and less than or equal to 0.02, is more preferably more than or equal to 0.004 and less than or equal to 0.0015, and is further preferably more than or equal to 0.005 and less than or equal to 0.01. Accordingly, each of the first region and the first unit layer has high hardness and excellent film quality.

Second region 3B can include two or more unit layers. In this case, the two or more unit layers preferably have different sp3 intensity ratios. For example, in diamond-coated tool 1 shown in FIG. 1, sp3 intensity ratio I2 of first unit layer 3c and sp3 intensity ratio I3 of second unit layer 3d are preferably different from each other. Accordingly, progress of crack is suppressed and wear resistance is improved.

Assuming that the x-th unit layer and the (x+1)-th unit layer are adjacent unit layers in the second region, a ratio ($I_x/I_{(x+1)}$) of $I_x$ and $I_{(x+1)}$ is preferably more than or equal to 0.1 and less than or equal to 10, is more preferably more than or equal to 0.15 and less than or equal to 6.5, and is further preferably more than or equal to 0.25 and less than or equal to 4, where $I_x$ represents the sp3 intensity ratio of the x-th unit layer and $I_{(x+1)}$ represents the sp3 intensity ratio of the (x+1)-th unit layer. Accordingly, progress of crack is suppressed and wear resistance is improved.

The thickness of the first region is preferably more than or equal to 0.1 μm and less than or equal to 20 μm, is more preferably more than or equal to 0.5 μm and less than or equal to 15 μm, and is further preferably more than or equal to 0.5 μm and less than or equal to 10 μm. This leads to very excellent adhesion between the substrate and the diamond and a very excellent effect of suppressing progress of crack.

The thickness of the second region is preferably more than or equal to 0.1 μm and less than or equal to 20 μm, is more preferably more than or equal to 0.2 μm and less than or equal to 15 μm, and is further preferably more than or equal to 0.2 μm and less than or equal to 10 μm. This leads to very excellent adhesion between the substrate and the diamond and a very excellent effect of suppressing progress of crack.

In the present specification, the term "thickness" refers to a length in a direction parallel to the normal line of interface P between the substrate and the diamond layer of the diamond-coated tool in a cross section parallel to the normal line. The thickness can be measured using a film cross section SEM (scanning electron microscope) observation image.

The thickness of each unit layer included in the second region is preferably more than or equal to 0.1 μM and less than or equal to 20 μm, is more preferably more than or equal to 0.1 μm and less than or equal to 10 μm, and is further preferably more than or equal to 0.2 μm and less than or equal to 5 μm.

Each of the unit layers included in the second region preferably includes columnar crystals. Accordingly, crack is suppressed from progressing in a direction perpendicular to the crystal growth axis of the diamond film.

Each of the unit layers may be entirely constituted only of a columnar crystal region, or may have not only the columnar crystal region but also another crystal region. A ratio of the columnar crystal region in each unit layer is preferably more than or equal to 50 volume %, is more preferably more than or equal to 70 volume %, and is further preferably more than or equal to 90 volume %.

In the present specification, the term "columnar crystal" refers to a crystal grown more in a direction approximated to the normal direction (vertical direction in FIG. 1) of interface P, in other words, the thickness direction of the diamond layer, than in the plane direction (horizontal direction in FIG. 1) of interface P. Such a columnar crystal has a shape having a width (diameter) w of more than or equal to 50 nm and less than or equal to 500 nm and a length 1 of more than or equal to 1000 nm and less than or equal to 10000 nm in the growth direction, for example. The columnar crystal region refers to a region constituted of the above-described columnar crystals.

In the present specification, the "ratio of the columnar crystal region" of each unit layer can be calculated in accordance with the following procedure of (e-1) to (e-5).

(e-1) Determination of Measurement Visual Fields

A measurement sample is cut out from the diamond-coated tool using a diamond saw blade, and is embedded in a resin. Then, a cross section polishing process (hereinafter, also referred to as "CP process") is performed onto a cross section thereof. The cutting and CP process described above are performed such that the cross section becomes parallel to the normal line of interface P between the substrate and the diamond layer.

In the cross section, within each unit layer, five rectangular measurement visual fields are selected at random. Each of the measurement visual fields has a width (direction parallel to interface P) of 6 μm and has a height (direction perpendicular to interface P) including the entire height (direction perpendicular to interface P) of each unit layer.

(e-2) Image Capturing of Measurement Visual Fields

An image of each of the measurement visual fields is captured using the following instrument and under the following conditions.

Scanning transmission electron microscope: "JEM-2100F/Cs" provided by JEOL.

Image capturing conditions: a magnification of 20000× and a light field image.

(e-3) Processing of Captured Image

The image captured in (e-2) above is subjected to image processing using the following image processing software in accordance with the following procedure.

Image processing software: "Winroof" provided by Mitani Corporation.

In order to clarify grain boundaries of the crystal grains of each unit layer, contrast is adjusted to divide, by a line, into a region (columnar crystal region) of the crystal grains each having a width (diameter) w of more than or equal to 50 nm and less than or equal to 500 nm and a length 1 of more than or equal to 1000 nm and less than or equal to 10000 nm in the growth direction.

(e-4) Analysis of Image

From the image obtained in (e-3) above, the area of the divided region (columnar crystal region) is calculated.

(e-5) Calculation of Ratio of Columnar Crystal Region in Each Unit Layer

In each of the five measurement visual fields, the area ratio of the region divided in (e-4) (hereinafter, also referred to as "area ratio of the columnar crystals") with respect to the total area of the unit layers in the measurement visual field is measured. An average value of the "area ratios of the columnar crystals" in the five measurement visual fields is calculated. The average value indicates "the ratio of the columnar crystal regions".

<Substrate>

For the substrate of the diamond-coated tool of the present disclosure, a substrate including well-known hard grains can be used. Examples of such a substrate can include, for example, a cemented carbide (for example, a WC-based cemented carbide, a material containing Co in addition to WC, or a material to which a carbonitride or the like of Ti, Ta, Nb or the like is further added), a cermet (mainly composed of TiC, TiN, TiCN or the like), a high-speed steel, a tool steel, a ceramic (such as titanium carbide, silicon carbide, silicon nitride, aluminum nitride, aluminum oxide, and a mixture thereof), a cubic boron nitride sintered material, a diamond sintered material, and the like.

As substrate 2 of the present embodiment, it is preferable to use a cemented carbide. Accordingly, residual stress of the diamond layer can be readily controlled to fall within the above-described range.

Substrate 2 preferably includes hard grains having a volume average grain size of more than or equal to 0.1 μm and less than or equal to 10 μm. Accordingly, adhesion force between substrate 2 and diamond layer 3 is improved. The volume average grain size of the hard grains is more preferably more than or equal to 0.1 μm and less than or equal to 5 μm, and is further preferably more than or equal to 0.2 μm and less than or equal to 3 μm.

The method for measuring the volume average grain size of the hard grains is basically the same as the method for calculating volume average grain size r1 of the diamond grains included in first region 3A. A different therebetween lies in that: one rectangular measurement visual field is set to have a width (direction parallel to interface P) of 6 μm and have a height including the entire height of the substrate in the direction perpendicular to interface P; and the circumscribed-circle equivalent diameters (grain sizes) of the hard grains are measured instead of the diamond grains. The measurement visual field is set at a position to have a height including the entire height of the substrate. The circumscribed-circle equivalent diameters (grain sizes) of all the hard grains in the measurement visual field are measured, and the volume average grain size is calculated based on these values.

The volume fraction of the hard grains in substrate 2 is preferably more than or equal to 85 volume % and less than or equal to 99 volume %, is more preferably more than or equal to 90 volume % and less than or equal to 97 volume %, and is further preferably more than or equal to 92 volume % and less than or equal to 96 volume %.

An arithmetic mean roughness Sa of the surface of substrate 2 is preferably more than or equal to 0.1 μm and less than or equal to 10 μm. The above-described "surface" refers to a surface coated with the diamond layer, and refers to a portion serving as an interface with the diamond layer. Accordingly, adhesion force between the substrate and the diamond layer is improved and the tool life becomes long. Arithmetic mean roughness Sa is more preferably more than or equal to 0.1 μm and less than or equal to 8 μm, and is further preferably more than or equal to 0.1 μm and less than or equal to 7 μm.

Arithmetic mean roughness Sa is a value measured based on ISO25178. For a measurement device, an optical laser microscope ("LEXT OLS3500" (trademark) provided by Olympus with a laser wavelength of 408 nm, a horizontal spatial resolution of 120 nm, and a height resolution of 10 nm) is used.

When substrate 2 is coated with diamond layer 3, the content of a Co (cobalt) element (hereinafter, also referred to as "Co content of the substrate surface") is preferably more than or equal to 0.01 mass % and less than or equal to 4 mass % in region S3 (corresponding to reference character 13 in FIG. 1) surrounded by interface P between substrate 2 and diamond layer 3 and an imaginary plane V2 separated from interface P by a distance of 1 μm (imaginary plane V2 is located within substrate 2). Accordingly, adhesion force between the substrate and the diamond layer is improved. The Co content in region S3 of the substrate is more preferably more than or equal to 0.01 mass % and less than or equal to 3.5 mass %, and is further preferably more than or equal to 0.01 mass % and less than or equal to 3 mass %.

The Co content in region S3 of the substrate is measured by energy dispersive X-ray spectrometry (EDX). Specifically, a measurement sample is cut out from the diamond-coated tool using a diamond saw blade or the like, and is embedded in a resin. Then, a cross section polishing process (hereinafter, also referred to as "CP process") is performed onto a cross section thereof. The cutting and CP process described above are performed such that the cross section becomes parallel to the normal line of interface P between the substrate and the diamond layer.

In the cross section, one rectangular measurement visual field having a width (direction parallel to interface P) of 6 μm and a height of 5 μm (direction perpendicular to interface P) is selected at random within region S3, and the Co content (mass %) is measured. The measurement visual field is set at a position to have a height including the entire height (direction perpendicular to interface P; 1 μm) of region S3. For an EDX device, "SD100GV" provided by JEOL is used.

<Method for Manufacturing Diamond-Coated Tool>

A method for manufacturing the diamond-coated tool according to the present embodiment is not limited particularly. For example, the method for manufacturing the diamond-coated tool can include: a step (hereinafter, also referred to as "substrate preparing step") of preparing the substrate; and a step (hereinafter, also referred to as "diamond layer forming step") of obtaining the diamond-coated tool by forming the diamond layer on the substrate through a chemical vapor deposition method.

(Substrate Preparing Step)

As the substrate, the substrate of the above-described embodiment is prepared. It is preferable to perform a surface treatment to the substrate such as a sandblast treatment or an etching treatment. Accordingly, an oxide film or contaminant on the substrate surface is removed. Further, by increasing the surface roughness of the substrate, adhesion force between the substrate and the diamond layer is improved.

The sandblast treatment can be performed by blasting SiC having a particle size of 30 μm to the substrate at a blast pressure of 0.15 to 0.35 MPa, for example.

The etching treatment is performed by an acid solution treatment with 30% nitric acid and an alkali treatment with Murakami's reagent, for example.

(Diamond Layer Forming Step)

Diamond powder (diamond seed crystals) is applied onto the surface of the substrate obtained by the substrate preparing step so as to perform a seeding treatment. On this occasion, an interval between the diamond seed crystals is preferably more than or equal to 0.1 μm and less than or equal to 10 μm, and is more preferably more than or equal to 0.1 μm and less than or equal to 5 μm.

Next, the diamond layer is formed by the CVD method on the surface of the substrate on which the diamond seed crystals are seeded, thereby obtaining the diamond-coated tool. For the CVD method, a conventionally known CVD method can be used. For example, a microwave plasma CVD method, a plasma jet CVD method, a hot-filament CVD method, or the like can be used.

The first region can be formed, for example, in the following manner: the substrate is disposed in a hot-filament CVD device, methane gas and hydrogen gas are introduced into the device at a volume-based mixing ratio of 0.5:99.5 to 10:90, and the substrate temperature is maintained at more than or equal to 700° C. and less than or equal to 900° C.

The second region can be formed, for example, in the following manner: the substrate is disposed in a hot-filament CVD device, methane gas and hydrogen gas are introduced into the device at a volume-based mixing ratio of 0.01:99.99 to 10:90, and the substrate temperature is maintained at more than or equal to 700° C. and less than or equal to 900° C.

When the second region includes two or more unit layers, the above-described mixing ratio of the methane gas and the hydrogen gas and the substrate temperature are adjusted for each of the unit layers.

<Application>

The diamond-coated tool according to the present embodiment can be used usefully as a cutting tool and an abrasion-resistant tool, for example. Examples of the cutting tool include an indexable cutting insert, a bite, a cutter, a drill, an end mill, and the like. Examples of the abrasion-resistant tool include a die, a bending die, a drawing die, a bonding tool, and the like.

EXAMPLES

The following describes the present embodiment more specifically by way of examples. However, the present embodiment is not limited by these examples.

[Sample 1 to Sample 8]

(Substrate Preparing Step)

As the substrate of the diamond-coated tool, a drill was used which was composed of WC-6% Co (cemented carbide) and which had a drill shape (having a drill diameter of 6.38 mm, a core thickness of 2 mm, a cutting edge length of 15 mm, and two cutting edges). The volume average grain size of the WC grains included in the substrate is indicated in the section "Grain Size" of "Substrate" in Table 1.

A sandblast treatment was performed onto a surface of the substrate. A blast pressure was 0.15 to 0.35 MPa and a blast time was 10 to 30 seconds. Then, the substrate was immersed in 30 mass % of nitric acid and was immersed in Murakami's reagent, thereby performing substrate etching.

(Measurement of Substrate)

An arithmetic mean roughness Sa of the above-described surface of the substrate having been subjected to the surface treatment was measured based on ISO25178. A specific measurement method is as described above in the above-described embodiment and is therefore not described repeatedly. A result thereof is shown in the section "Sa" of "Substrate" in Table 1.

TABLE 1

| | | | | First Region | | | | | | | |
|---|---|---|---|---|---|---|---|---|---|---|---|
| | Substrate | | | Region S1 | | | | | First Unit Layer | | |
| | Grain | | Co | Area Ratio of Random Crystal | | | | | Ratio of Columnar Crystal | | |
| Sample No. | Size (μm) | Sa (μm) | Content (Mass %) | Growth Grains (%) | r1 (μm) | σ1 (GPa) | l1 | Thickness (μm) | Region (%) | r2 (μm) | σ2 (GPa) |
| 1 | 0.5 | 2 | 1.8 | 0 | 0.1 | −1 | 0.002 | 4 | 90 | 1 | −2 |
| 2 | 2 | 3 | 1.8 | 40 | 0.1 | −1 | 0.01 | 4 | 90 | 1 | −2 |
| 3 | 1 | 2 | 2.5 | 50 | 0.5 | −1.5 | 0.02 | 5 | 95 | 2 | −2.5 |
| 4 | 0.5 | 2 | 3 | 30 | 1 | −0.5 | 0.01 | 3 | 90 | 2 | −2.5 |
| 5 | 2 | 3 | 3 | 20 | 0.2 | 1 | 0.002 | 2 | 60 | 0.5 | −2 |
| 6 | 2 | 2 | 0.5 | 20 | 0.1 | 1 | 0.01 | 5 | 70 | 0.7 | −0.5 |
| 7 | 1 | 2 | 0.05 | 50 | 0.3 | 1 | 0.015 | 7 | 60 | 0.5 | −1 |
| 8 | 0.5 | 1 | 4 | 80 | 2 | −1 | 0.02 | 10 | 95 | 2 | −2 |

TABLE 1-continued

| | First Unit Layer | Second Unit Layer | | | | | | | Tool |
|---|---|---|---|---|---|---|---|---|---|
| | | Ratio of Columnar Crystal | | | | | | | |
| Sample No. | Thickness l2 (μm) | Region (%) | r3 (μm) | σ3 (GPa) | l3 | Thickness (μm) | r1/r2 | l1/l2 | Life (Holes) |
| 1 | 0.002 | 5 | 90 | 0.7 | −0.5 | 0.02 | 5 | 0.1 | 1.0 | 600 |
| 2 | 0.005 | 5 | 90 | 0.7 | −0.5 | 0.02 | 5 | 0.1 | 2.0 | 1700 |
| 3 | 0.005 | 5 | 95 | 2.5 | −3 | 0.02 | 5 | 0.25 | 4.0 | 1600 |
| 4 | 0.007 | 10 | — | — | — | — | 0 | 0.5 | 1.4 | 1200 |
| 5 | 0.02 | 3 | 70 | 0.7 | −0.5 | 0.02 | 4 | 0.4 | 0.1 | 1100 |
| 6 | 0.02 | 3 | 60 | 0.3 | −3 | 0.01 | 4 | 0.14 | 0.5 | 1300 |
| 7 | 0.002 | 5 | 90 | 1 | −2 | 0.015 | 4 | 0.6 | 7.5 | 1500 |
| 8 | 0.002 | 2 | 95 | 2.5 | −3 | 0.005 | 2 | 1 | 10.0 | 1200 |

(Diamond Layer Forming Step)

Diamond powder was applied onto the above-described surface of the substrate having been through the surface treatment, thereby performing a seeding treatment. The seeding treatment was performed in the following manner: the diamond powder having an average particle size of 5 μm was rubbed against the substrate surface, and then the substrate was cleaned in ethanol and dried.

The substrate having been through the seeding treatment was set in a well-known hot-filament CVD device to form a diamond layer, thereby obtaining a diamond-coated tool.

A pressure during the film formation was maintained at $5 \times 10^3$ Pa by way of a gas flow rate and a pressure regulation mechanism. A filament temperature was set to 1900 to 2000° C. A film formation time for the first region was 7.5 to 24 hours, a film formation time for the first unit layer was 4.5 to 25 hours, and a film formation time for the second unit layer was 4 to 13 hours.

The composition of the introduced gas (the methane gas and hydrogen gas), the substrate temperature, and the film formation time in each of the steps of forming the first region, the first unit layer, and the second unit layer in each sample are respectively indicated in the sections "Introduced Gas", "Substrate Temperature", and "Film Formation Time" in Table 2.

(Co Content of Substrate)

In the diamond-coated tool, the Co content in region S3 of the substrate was measured by energy dispersive X-ray spectroscopy. A specific measurement method is as described above in the above-described embodiment and is therefore not described repeatedly. A result thereof is shown in the section "Co Content" of "Substrate" in Table 1.

(Measurement of Diamond Layer)

In region S1 in the first region of the obtained diamond-coated tool, an average value of "area ratios of random growth crystal grains" was calculated. A specific calculation method is as described above in the above-described embodiment and is therefore not described repeatedly. The average value of the "area ratios of the random growth crystal grains" in the five measurement visual fields are shown in the section "Area Ratio of Random Growth Crystal Grains" in Table 1.

Respective volume average grain sizes of the diamond grains in the first region, the first unit layer, and the second unit layer of the obtained diamond-coated tool were calculated. A specific calculation method is as described above in the above-described embodiment and is therefore not described repeatedly. Results thereof are shown in the sections "r1", "r2", and "r3" in Table 1.

Respective average residual stresses of the first region, the first unit layer, and the second unit layer of the obtained diamond-coated tool were measured by Raman spectroscopy. A specific measurement method is as described above in the above-described embodiment and is therefore not described repeatedly. Results thereof are shown in the sections "σ1", "σ2", and "σ3" in Table 1.

Respective sp3 intensity ratios of the first region, the first unit layer, and the second unit layer of the obtained diamond-coated tool were measured. A specific measurement method is as described above in the above-described

TABLE 2

| | First Region | | | | First Unit Layer | | | | Second Unit Layer | | | |
|---|---|---|---|---|---|---|---|---|---|---|---|---|
| | Introduced Gas (Volume %) | | Substrate Temperature (° C.) | Film Formation Time (Hours) | Introduced Gas (Volume %) | | Substrate Temperature (° C.) | Film Formation Time (Hours) | Introduced Gas (Volume %) | | Substrate Temperature (° C.) | Film Formation Time (Hours) |
| Sample No. | Methane Gas | Hydrogen Gas | | | Methane Gas | Hydrogen Gas | | | Methane Gas | Hydrogen Gas | | |
| 1 | 5 | 95 | 800 | 10 | 3 | 97 | 780 | 14 | 1 | 99 | 840 | 13 |
| 2 | 1 | 99 | 800 | 10 | 3 | 97 | 780 | 14 | 1 | 99 | 840 | 13 |
| 3 | 1 | 99 | 840 | 12.5 | 5 | 95 | 800 | 12.5 | 0.5 | 99.5 | 800 | 12.5 |
| 4 | 3 | 97 | 800 | 7.5 | 3 | 97 | 800 | 25 | — | — | — | — |
| 5 | 3 | 97 | 780 | 8 | 1 | 99 | 800 | 7.5 | 1 | 99 | 800 | 10 |
| 6 | 3 | 97 | 760 | 13 | 1 | 99 | 840 | 7.5 | 2 | 98 | 800 | 10 |
| 7 | 1 | 99 | 800 | 16 | 5 | 95 | 780 | 12.5 | 3 | 97 | 800 | 10 |
| 8 | 1 | 99 | 840 | 24 | 3 | 97 | 780 | 4.5 | 3 | 97 | 780 | 4 | embodiment and is therefore not described repeatedly. Results thereof are shown in the sections "I1", "I2", and "I3" in Table 1.

Respective thicknesses of the first region, the first unit layer, and the second unit layer of the obtained diamond-coated tool were measured using a film cross section SEM (scanning electron microscope) observation image. Results thereof are shown in the section "Thickness" in Table 1.

Respective ratios of columnar crystal regions were measured in the first unit layer and the second unit layer of the obtained diamond-coated tool. A specific measurement method is as described above in the above-described embodiment and is therefore not described repeatedly. Results thereof are shown in the section "Ratio of Columnar Crystal Region" in Table 1.

(Cutting Test)

A CFRP plate (having a plate thickness of 12.7 mm) was processed using the obtained diamond-coated tool under below-described conditions. The tool life was represented by the number of holes formed until the size of delamination (interlayer detachment) during the processing reached 0.6 mm. It is indicated that the tool life is longer as the number of holes is more. A result thereof is shown in the section "Tool Life" in Table 1.

(Cutting Conditions)

Processing speed S: 120 m/min.

Feed f: 0.1 mm/rev.

(Analysis)

Sample 2 to sample 8 correspond to Examples of the present disclosure. Sample 1 corresponds to a Comparative Example. Each of sample 2 to sample 8 (Examples) had a tool life about twice or more as large as the tool life of sample 1 (Comparative Example). That is, it was confirmed that each of sample 2 to sample 8 had a long tool life even in high-efficient processing of a difficult-to-cut material.

This is presumably because the cutting edge was not rounded and cuttability was maintained in each of sample 2 to sample 8 due to the following two reasons (1) and (2): (1) since adhesion force of the diamond film at the substrate interface was high, detachment from the substrate was suppressed; and (2) since the wear resistance of the diamond film was high to thereby suppress progress of crack, the diamond film was worn slowly.

FIG. 2 shows a transmission electron microscope photograph of a cross section of the diamond-coated tool of sample 2 (Example). From FIG. 2, it is understood that the crystal growth directions of the crystal grains are random within region S1 in the diamond layer of sample 2 (Example).

Sample 1, which corresponds to the Comparative Example, had a tool life corresponding to 600 holes, which were about 0.5 time or less as large as those of the Examples. This is presumably because the substrate at the cutting edge was exposed immediately after starting the cutting test, the substrate was worn, the cutting edge was accordingly rounded, and the cuttability could not be maintained due to the following two reasons (1) and (2): (1) since adhesion force at the substrate interface was low, the diamond film was detached immediately after starting the cutting test; and (2) since the wear resistance of the diamond film was low, the film was worn immediately.

Figure 6:
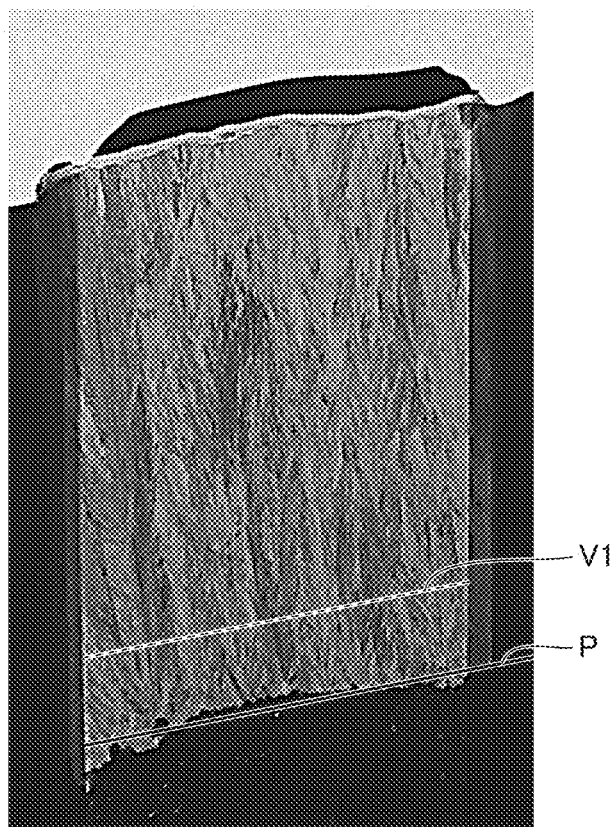
FIG. 6 shows a scanning transmission electron microscope photograph of a cross section of a diamond-coated tool of a sample 1 (Comparative Example).

FIG. 6 shows a transmission electron microscope photograph of a cross section of the diamond-coated tool of sample 1 (Comparative Example). From FIG. 6, it is understood that in the diamond layer of sample 1 (Comparative Example), the crystal growth directions of the crystal grains in region S1 were not random and were aligned in the thickness direction and region S1 was constituted of columnar crystals.

Heretofore, the embodiments and examples of the present invention have been illustrated, but it has been initially expected to appropriately combine the configurations of the embodiments and examples and modify them in various manners.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1: diamond-coated tool; 2: substrate; 3: diamond layer; 3A: first region; 3B: second region; 3c: first unit layer; 3d: second unit layer; 11: region S1; 12: region S2; 13: region S3; P: interface; Q: upper surface; V1: imaginary plane; D1, D2, D3: first reference line; E1, E2, E3, E4, E5, E6: second reference line; F1, F2: frame line of measurement visual field.

The invention claimed is:

1. A diamond-coated tool comprising: a substrate; and a diamond layer that coats the substrate, wherein
the diamond layer includes a first region that is in contact with the substrate,
the first region includes a region S1 surrounded by an interface P between the substrate and the diamond layer and an imaginary plane V1 separated from the interface P by a distance of 2 μm,
the region S1 has crystal grains grown in random directions,
the first region includes diamond grains having a volume average grain size r1 of more than or equal to 0.1 μm and less than or equal to 2 μm,
the diamond layer includes a second region formed on the first region,
the second region includes one or more unit layers,
the unit layers include a first unit layer that is in contact with the first region, and
a ratio (r1/r2) of the r1 and r2 is more than or equal to 0.05 and less than or equal to 20, where the r2 represents a volume average grain size of diamond grains included in the first unit layer.

2. The diamond-coated tool according to claim 1, wherein the substrate includes hard grains having a volume average grain size of more than or equal to 0.1 μm and less than or equal to 10 μm.

3. The diamond-coated tool according to claim 1, wherein the substrate has a surface having an arithmetic mean roughness Sa of more than or equal to 0.1 μm and less than or equal to 10 μm.

4. The diamond-coated tool according to claim 1, wherein the substrate has a Co content of more than or equal to 0.01 mass % and less than or equal to 4 mass % in a region S3 surrounded by the interface P and an imaginary plane V2 separated from the interface P by a distance of 1 μm.

5. The diamond-coated tool according to claim 1, wherein the second region includes two or more unit layers, and the two or more unit layers have respective different volume average grain sizes of diamond grains.

6. The diamond-coated tool according to claim 1, wherein the second region includes two or more unit layers, and the two or more unit layers have respective different average residual stresses.

7. The diamond-coated tool according to claim 1, wherein the second region includes two or more unit layers, and the two or more unit layers have respective different sp3 intensity ratios.

8. The diamond-coated tool according to claim 1, wherein the unit layers include columnar crystals.

9. A diamond-coated tool comprising: a substrate; and a diamond layer that coats the substrate, wherein
the diamond layer includes a first region that is in contact with the substrate,
the first region includes a region S1 surrounded by an interface P between the substrate and the diamond layer and an imaginary plane V1 separated from the interface P by a distance of 2 μm,
the region S1 has crystal grains grown in random directions,
the diamond layer includes a second region formed on the first region,
the second region includes one or more unit layers, and an average residual stress σ1 of the first region is different from an average residual stress σ2 of a first unit layer that is in contact with the first region.

10. A diamond-coated tool comprising: a substrate; and a diamond layer that coats the substrate, wherein
the diamond layer includes a first region that is in contact with the substrate,
the first region includes a region S1 surrounded by an interface P between the substrate and the diamond layer and an imaginary plane V1 separated from the interface P by a distance of 2 μm,
the region S1 has crystal grains grown in random directions,
the diamond layer includes a second region formed on the first region,
the second region includes one or more unit layers, and
a ratio (I1/I2) of I1 and I2 is more than or equal to 0.1 and less than or equal to 10, where the I1 represents a sp3 intensity ratio of the first region and the I2 represents a sp3 intensity ratio of a first unit layer that is in contact with the first region.

* * * * *